United States Patent
Doong et al.

(10) Patent No.: US 7,825,678 B2
(45) Date of Patent: Nov. 2, 2010

(54) TEST PAD DESIGN FOR REDUCING THE EFFECT OF CONTACT RESISTANCES

(75) Inventors: Yih-Yuh Doong, Hsin-Chu (TW); Tseng Chin Lo, Hsin-Chu (TW); Chien-Chang Lee, Hsin-Chu (TW); Chih-Chieh Shao, Miaoli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 144 days.

(21) Appl. No.: 12/196,531

(22) Filed: Aug. 22, 2008

(65) Prior Publication Data

US 2010/0045325 A1 Feb. 25, 2010

(51) Int. Cl.
    *G01R 31/02* (2006.01)
(52) U.S. Cl. .................. 324/763; 324/754; 324/765
(58) Field of Classification Search .............. None
    See application file for complete search history.

(56) References Cited

U.S. PATENT DOCUMENTS

| | | |
|---|---|---|
| 5,051,690 A | 9/1991 | Maly et al. |
| 5,539,325 A | 7/1996 | Rostoker et al. |
| 6,528,818 B1 | 3/2003 | Satya et al. |
| 6,791,344 B2 * | 9/2004 | Cook et al. .................. 324/754 |
| 6,820,046 B1 | 11/2004 | Lamson et al. |
| 6,873,146 B2 | 3/2005 | Liu |
| 6,921,672 B2 | 7/2005 | Satya et al. |
| 6,989,682 B1 * | 1/2006 | Shen et al. .................. 324/763 |
| 7,126,359 B2 | 10/2006 | Huang et al. |
| 7,224,176 B2 | 5/2007 | Ryu et al. |
| 7,394,270 B2 | 7/2008 | Jimi |
| 7,475,000 B2 | 1/2009 | Cook et al. |
| 2002/0144212 A1 | 10/2002 | Lev et al. |
| 2003/0034489 A1 | 2/2003 | Bhattacharya et al. |
| 2004/0017217 A1 | 1/2004 | Ryu et al. |
| 2004/0178787 A1 | 9/2004 | Liu |
| 2006/0067143 A1 | 3/2006 | Kim |
| 2008/0073753 A1 | 3/2008 | Tsai et al. |
| 2008/0244475 A1 | 10/2008 | Lo et al. |
| 2008/0303539 A1 | 12/2008 | Chen et al. |

* cited by examiner

*Primary Examiner*—Minh N Tang
(74) *Attorney, Agent, or Firm*—Slater & Matsil, L.L.P.

(57) ABSTRACT

An integrated circuit structure includes a semiconductor wafer; integrated circuit devices in the semiconductor wafer; and a plurality of test pads on a top surface of the semiconductor wafer and connected to the integrated circuit devices. Test pads are grouped in pairs, with the test pads in a same pair are interconnected.

12 Claims, 4 Drawing Sheets

TEST PAD DESIGN FOR REDUCING THE EFFECT OF CONTACT RESISTANCES

CROSS-REFERENCE TO RELATED APPLICATION

This application relates to commonly-assigned U.S. patent application Ser. No. 11/731,444, filed Mar. 30, 2007, and entitled "High Accuracy and Universal On-Chip Switch Matrix Testline," which application is hereby incorporated herein by reference.

TECHNICAL FIELD

This invention relates generally to the manufacturing of integrated circuits, and more particularly to wafer acceptance tests, and even more particularly to reducing the effect of contact resistances of test pads.

BACKGROUND

Integrated circuit (IC) manufacturers are employing increasingly smaller dimensions and corresponding technologies to make smaller, high-speed semiconductor devices. Along with these advancements, the challenges of maintaining yield and throughput have also increased.

A semiconductor wafer typically includes dies (or chips) separated from each other by scribe lines. Individual chips within the wafer contain circuitry, and the dies are separated by sawing and then are individually packaged. In a semiconductor fabrication process, semiconductor devices on wafers (e.g., an integrated circuit) must be tested at selected steps, or at the end, of the formation so as to maintain and assure device quality. Usually, a testing circuit is simultaneously fabricated on the wafer along with the actual devices. A typical testing method provides a plurality of test pads (commonly referred to as process control monitor pads, or PCM pads) located on the surface scribe lines. The test pads are selected to test different properties of the wafers, such as voltages, drive currents, leakage currents, and the like.

FIG. 1 illustrates test line 10, which may be formed in a scribe line of a wafer, and may include more or fewer test pads (named as TP1 through TP10) than shown in FIG. 1. Each of test pads TP1 through TP10 is connected to a node of the device (or circuit) to be probed. For example, test pads TP1 through TP4 may be used to probe a transistor by connecting to the source, drain, gate, and bulk of the transistor.

A portion of a test scheme is shown in FIG. 2, which is used to test (probe) transistor 22. Drain 24 of transistor 22 is connected to test pad TP1. Sense-measurement-unit (SMU) 12 is connected to test pad TP1 through a test pin, which is symbolized by node 14. Resistor Rc represents the contact resistance between the test pin and test pad TP1. SMU 12 has a forcing node 16, which is connected to the output of amplifier 18, and a sensing node 20, which is connected to the negative input of amplifier 18. To test transistor 22, SMU 12 tries to force a voltage, for example, of 1V to drain 24 of transistor 22, and the current I flowing through transistor 22 is sensed.

Due to the contact resistance Rc, the voltage applied on drain 24 of transistor 22 is reduced. For example, if contact resistance Rc is 30 Ohms, and current I is 1 mA, the voltage drop on the contact resistance Rc is 30 mV. When the voltage at test pin 14 is 1V, the voltage applied on drain 24 drops to 0.97V, which is a three percent shift from the desirable voltage. The sensed current is shifted accordingly, causing the inaccuracy of the evaluation in the performance of transistor 22.

For a 32 nm nominal device having a gate width of about 1 μm and a gate length of about 0.04 μm, the shift in the sensed performance may reach as great as about 10 percent. To make it worse, the contact resistance Rc is affected by various factors, such as the queue-time of the probed wafer, the probe card overdrive, and the probe card quality. As a result, contact resistance Rc may vary in a wide range, making it very difficult to compensate for the inaccuracy of the probe. Accordingly, what is needed in the art is a sensing scheme and structure that may overcome the deficiencies of the prior art.

SUMMARY OF THE INVENTION

In accordance with one aspect of the present invention, an integrated circuit structure includes a semiconductor wafer; integrated circuit devices in the semiconductor wafer; and a plurality of test pads on a top surface of the semiconductor wafer and connected to the integrated circuit devices. Test pads are grouped in pairs, with the test pads in each pair of the plurality of test pads interconnected to each other.

In accordance with another aspect of the present invention, an integrated circuit structure includes a semiconductor wafer including a first semiconductor chip and a second semiconductor chip; a scribe line between the first and the second semiconductor chips; a test line in the scribe line; and a first, a second, a third, and a fourth test pad in the test line. The first and the second test pads are interconnected to form a first pair. The third and the fourth test pads are interconnected to form a second pair.

In accordance with yet another aspect of the present invention, an integrated circuit probing device includes a plurality of sense-measurement-units, each including a forcing node; and a sensing node electrically coupled to the forcing node. The integrated circuit probing device further includes a probe card including a plurality of pairs of probe pins. Each pair of probe pins includes a first probe pin connected to the forcing node, and a second probe pin connected to the sensing node, wherein the forcing node and the sensing node are in a same one of the plurality of sense-measurement-units.

The advantageous features of the present invention include reduced effect of contact resistances between probe pins and test pads. The accuracy of the probing is thus improved.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel test pad design and the corresponding probe scheme are provided. The variations and operation of the preferred embodiments are discussed. Throughout the various views and illustrative embodiments of the present invention, like reference numbers are used to designate like elements.

Figure 1:
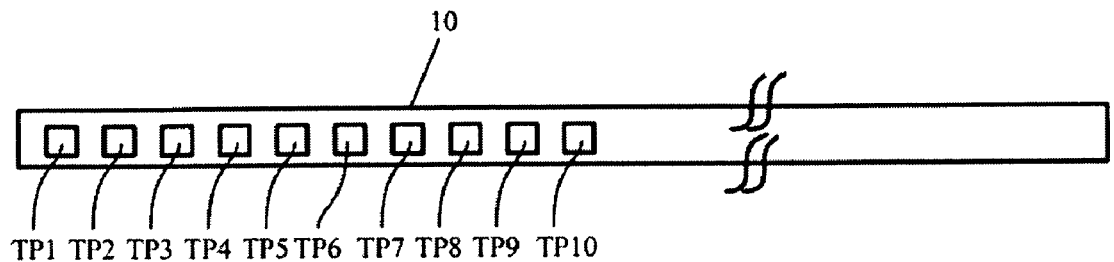
FIG. 1 illustrates a conventional test line having a plurality of test pads.
Figure 2:
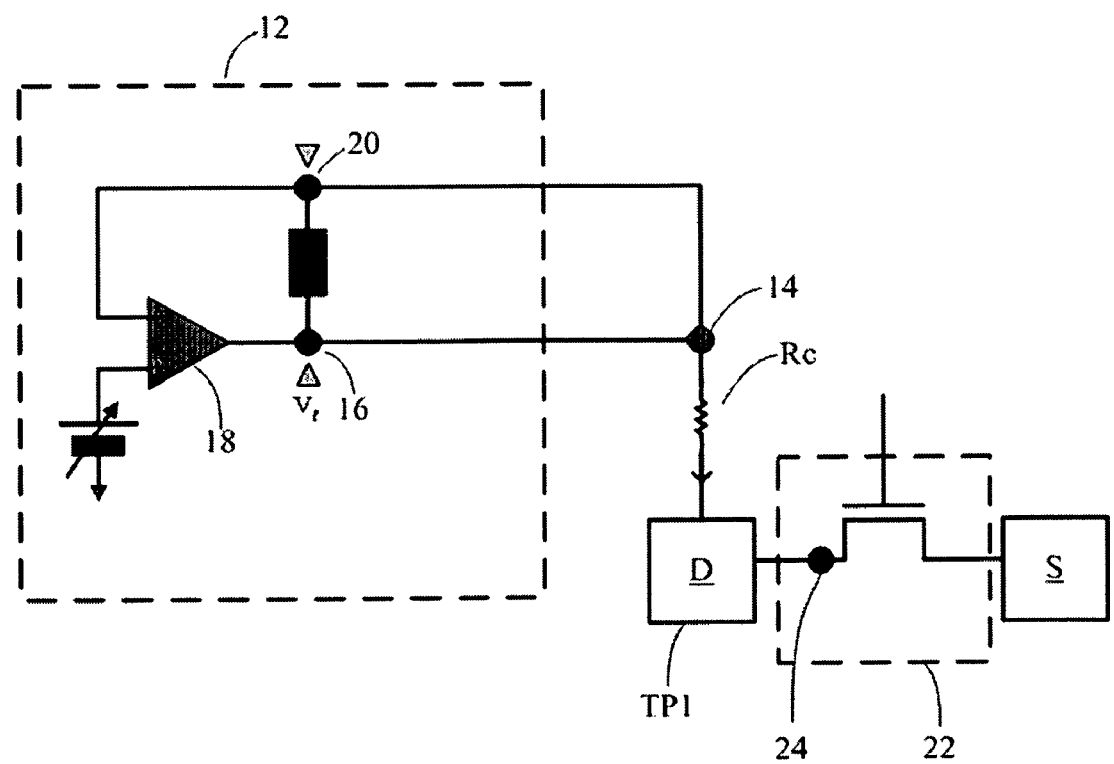
FIG. 2 illustrates a conventional test scheme, wherein the forcing node and the sensing node of a sense-measurement-unit are connected to a node of a device to be probed.
Figure 3:
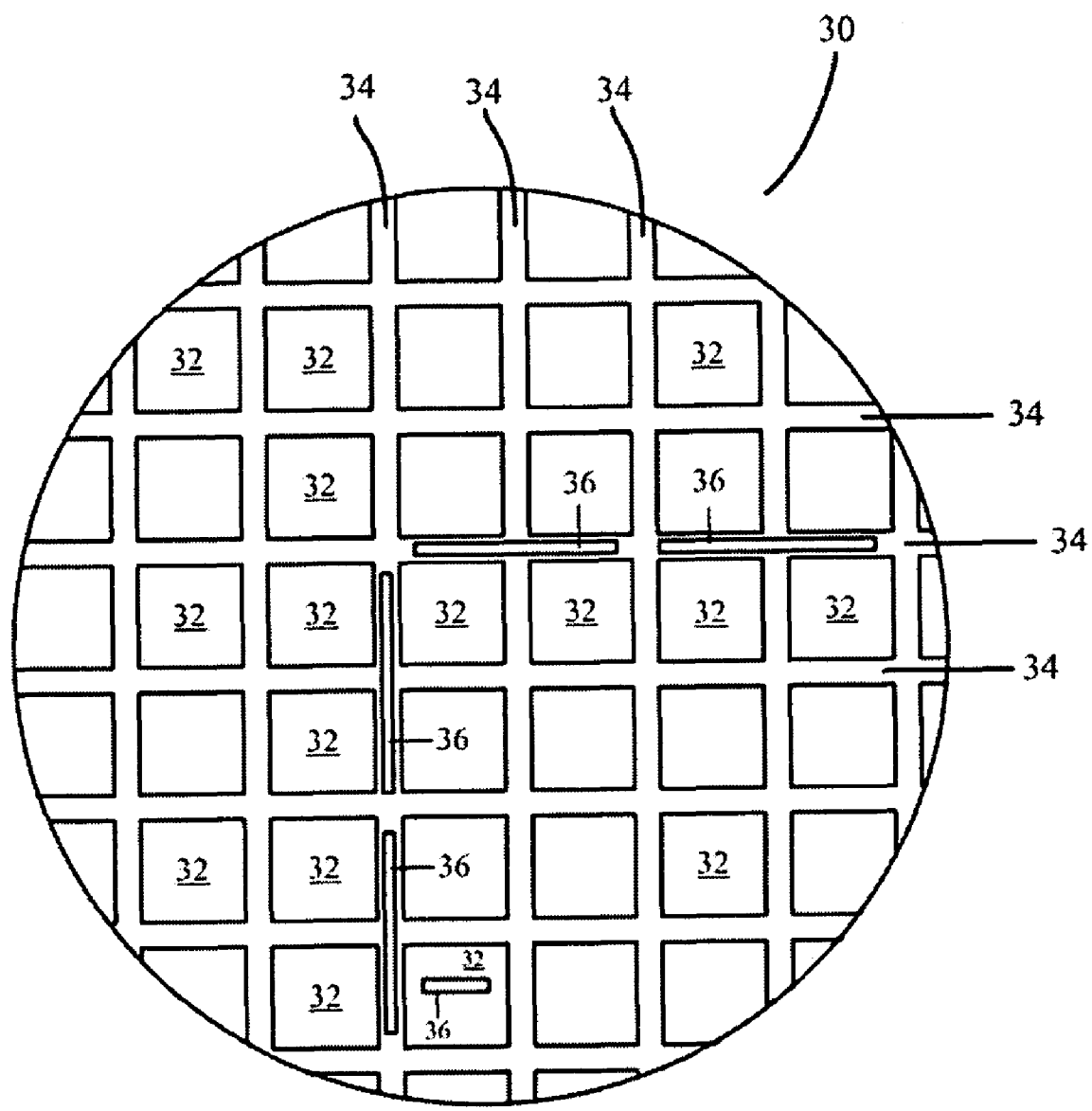
FIG. 3 illustrates a wafer having a plurality of semiconductor chips, and scribe lines separating the semiconductor chips, wherein test lines are located in the scribe lines.

FIG. 3 illustrates wafer 30 including a plurality of semiconductor chips 32 therein. Semiconductor chips 32 are separated from each other by scribe lines 34, which are to be sawed during packaging processes in order to separate semiconductor chips 32 from each other. Test lines 36 are formed in wafer 30. Each test line 36 includes a plurality of test pads TP (not shown in FIG. 3, please refer to FIG. 4) exposed through the top surface of wafer 30. In the preferred embodiment, test lines 36 are formed in scribe lines 34. In alternative embodiments, test lines 36 may be formed inside semiconductor chips 32.

Figure 4:
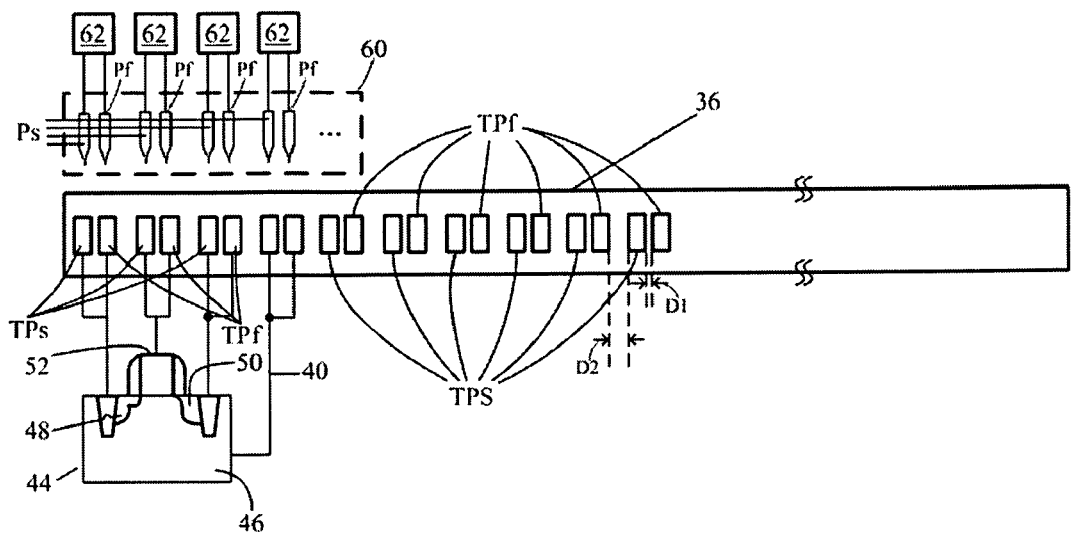
FIG. 4 illustrates a test line embodiment of the present invention, wherein test pads in the test line are formed as interconnected pairs.

FIG. 4 illustrates a top view of an embodiment of an exemplary test line 36. In the preferred embodiment, test pads TP (denoted as either test pads TPs or TPf) are formed as pairs. In each pair, one of the test pads TP is used for forcing voltages or currents during the probing of wafer 30, and hence is referred to as forcing pad TPf. The other test pad of the pair is used for sensing voltages or currents, and hence is referred to as sensing pad TPs. The design and the dimensions of sensing pads TPs may be identical to that of forcing pads TPf. The connection and the function of a test pad TP during the probing determine whether a test pad is a forcing pad or a sensing pad.

In each pair of the test pads 36, sensing pad TPs and forcing pad TPf are interconnected, and are connected to a same node of the device (or a circuit) to be sensed (also referred to as device-under-test, or DUT). Throughout the description, when two test pads are referred to as being "interconnected," it means the test pads are connected only through the commonly used interconnection lines and vias, and no active devices such as transistors are formed therebetween. Further, no passive devices such as resistors, capacitors, and/or inductors are intentionally formed between the interconnected test pads, although parasitic passive devices are sometimes inevitable. However, the parasitic passive devices need to have as small as possible effect on the interconnected test pads. For example, the resistances of the connection lines between the sensing pad TPs and the forcing pad TPf in a same pair are as small as possible. Accordingly, the forcing pad TPf and the sensing pad TPs may be interconnected at a point close to the forcing pad TPf and the sensing pad TPs, or in other words, close to the top surface of the respective semiconductor chip. In an exemplary embodiment, a metal line in the passivation layer or the top metallization layer interconnects a pad TPs to a pad TPf. The DUT is then connected to the metal line through a common conductive path 40, as is also shown in FIG. 4.

By using test line 36 as shown in FIG. 4, each of the nodes in the DUT is connected to a pair of, instead of only one, test pads TP. In the exemplary embodiment as shown in FIG. 4, transistor 44, which is a DUT, includes bulk (substrate) 46, drain 48, source 50, and gate 52. Therefore, for the probing of transistor 44, four pairs of test pads TP are needed, with each pair being interconnected, and connected to one of the above-discussed nodes. One skilled in the art will realize that for different DUTs, more or fewer pairs of test pads may be needed. For example, for probing a resistor, only two pairs of test pads are needed.

Figure 5:
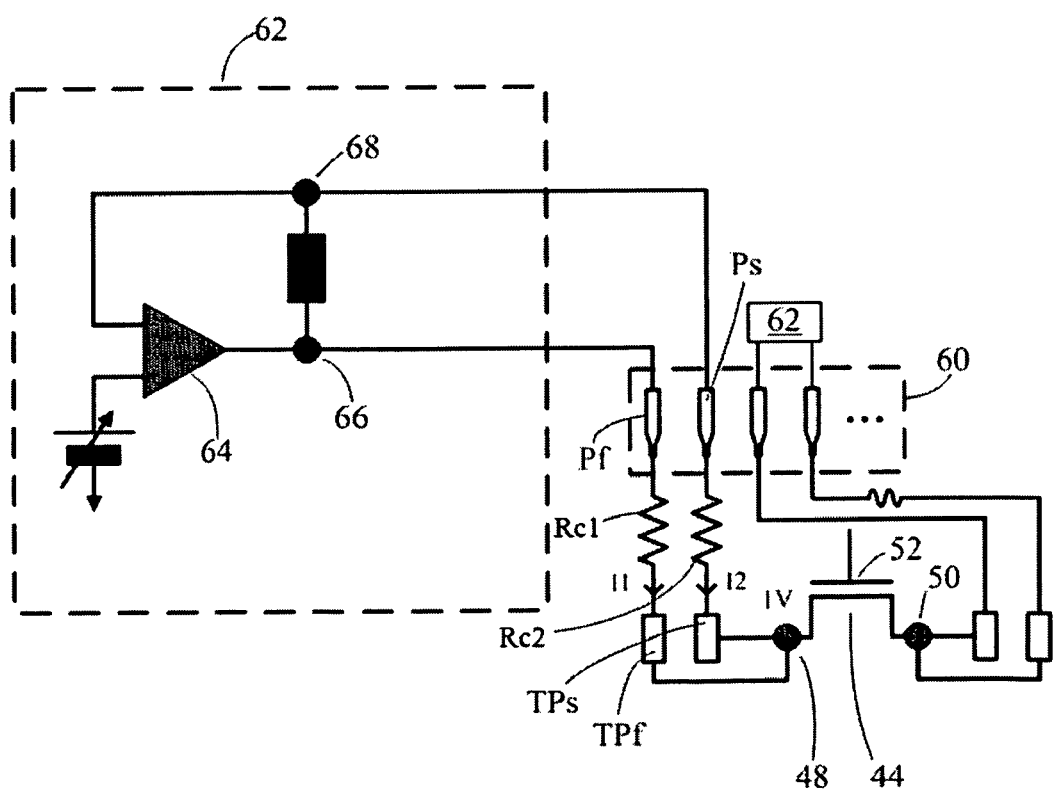
FIG. 5 illustrates a test scheme of the present invention, wherein a sense-measurement-unit includes a force node and a sense node connected to a pair of test pads.

Since each pair of test pads TP is physically separated from other pairs, for the probing of each node of the DUT, a pair of probe pins is needed. FIG. 4 schematically illustrates probe card 60, which includes a plurality of pairs of probe pins P (denoted either as Pf or Ps). Each pair of probe pins P is connected to a sense-measurement-unit (SMU) 62, wherein more details of SMUs 62 are shown in FIG. 5. Each of the SMUs 62 has two ends, each being connected to one of the probe pins Pf and Ps, wherein probe pins Pf are used to force voltages and/or currents to the DUT, and probe pins Ps are used to sense voltages and/or currents. The positions of the probe pins Pf and Ps are arranged corresponding to that of test pads TP, so that each of the probe pins Ps/Pf may be in contact with one, and only one, of test pads TP. In other words, with the design of probe card 60 known, test pads TP need to be arranged to match the positions of probe pins P.

FIG. 5 illustrates an exemplary scheme for connecting SMU 62 to transistor 44, which is used as an exemplary DUT. Please note SMU 62 is illustrated as having operational amplifier 64, which is commonly used in the sense-measurement-units. However, in the embodiments of the present invention, a sense-measurement-unit may have different designs. SMU 62 is connected to a pair of test pads, including sensing pad TPs and forcing pad TPf. SMU 62 includes forcing node 66, which is connected to the output of operational amplifier 64, and sensing node 68, which is connected to one of the inputs of operational amplifier 64. Resistor Rc1 represents the contact resistance between test pin Pf and test pad TPf, and resistor Rc2 represents the contact resistance between test pin Ps and test pad TPs.

To probe transistor 44, SMU 62 tries to force a voltage, for example 1V, to drain 48 of transistor 44. Accordingly, the voltage at sensing node 68 is set to 1V. Since the forcing and sensing paths are separated, current I2 flowing through contact resistor Rc2 may be very low, and may be in the order of nano amps. In an exemplary embodiment, assuming current I2 is 1 nA, and contact resistor Rc1 has a resistance of 30 Ohms, the voltage drop on the contact resistor Rc2 is thus only 0.03 mV. The voltage applied on drain 48 of transistor 44 is (1V-0.03 mV), or 0.99997 V. Therefore, contact resistance Rc2 has very little effect on the accuracy of the probe, and the desirable voltages can be accurately applied on drain 48. Current I1 may be sensed through test pad TPs. Since the voltage applied on drain 48 is accurate, the sensed current I1 is also accurate. In the preferred embodiment, during the probing, current I2 is at least two orders lower than current I1.

Similarly, an additional SMU 62 is connected to source 50 of transistor 44 through a pair of test pads. Although not shown in FIG. 5, gate 52 and possibly the bulk (substrate) of transistor 44 are also each connected to a SMU 62 through a pair of test pads. A schematic connection is shown in FIG. 4.

Referring back to FIG. 4, in an embodiment of the present invention, the forcing pad Pf and sensing pad Ps in same pairs are closely located. In an exemplary embodiment, distance D1 between a forcing pad TPf and a sensing pad TPs in a same pair is less than about 10 μm, and is more preferably between about 0.2 μm and about 10 μm, while distance D2 between neighboring test pad pairs is greater than about 10 μm, and is more preferably between about 10 μm and about 100 μm. A ratio of distance D1 to distance D2 may be less than 1, and is more preferably between about 1/50 and about 1. Accordingly, in probe card 60, the probe pins P that belong to a same pair are located closely to match the spacings of test pads TP.

Figure 6:
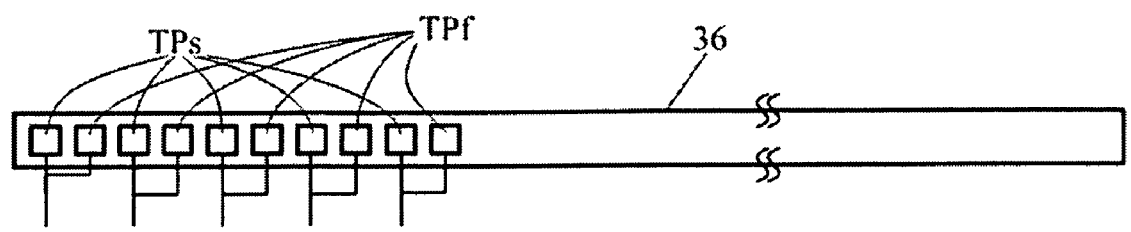
FIG. 6 illustrates a test line, wherein the test pads in the test line are equally spaced, and wherein neighboring test pads in a same pair are interconnected.

FIG. 6 illustrates an alternative embodiment of the present invention. In test line 36, the test pads TP are equally spaced. However, sensing pads TPs and forcing pads TPf are placed in an alternating pattern, and sensing pads TPs are connected to respective neighboring forcing pads TPf to form test pad pairs.

Figure 7:
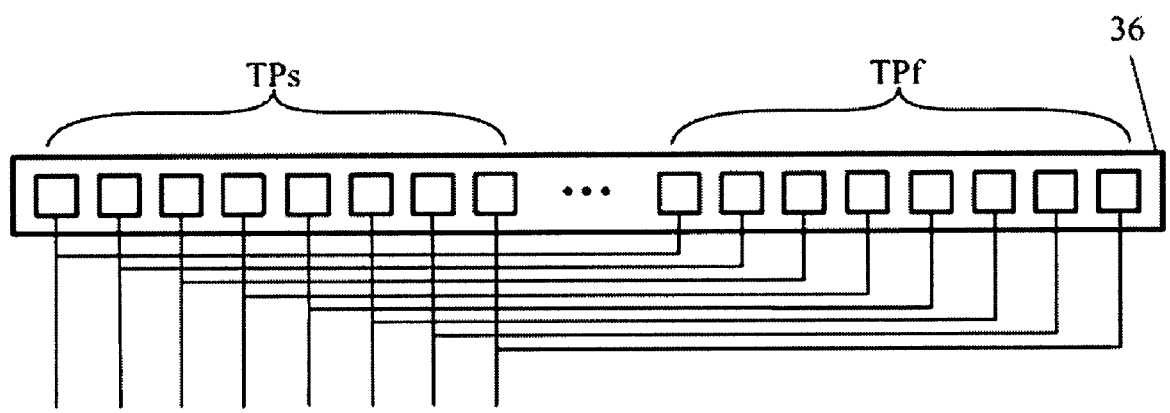
FIG. 7 illustrates a test line, wherein the test pads in the test line are equally spaced, and wherein test pads in a same pair are separated from each other by test pads in other pairs.

FIG. 7 illustrates yet another embodiment of the present invention. In test line 36, the test pads TP are equally spaced. Sensing pads TPs are placed together as a group, and forcing pads TPf are placed together as another group. Each of the sensing pads TPs is still connected to one of the forcing pads TPf to form a test pad pair. One skilled in the art will realize there are many variations for how to place sensing pads TPs and forcing pads TPf to suit different test requirements. The design of probe card 60 (refer to FIG. 4) is also arranged accordingly.

In the above-discussed embodiments, test lines are used as examples to explain the concept of the present invention. However, the teaching of the embodiments of the present invention may be applied to test keys, and may be used in the probing of circuits inside semiconductor chips (as compared to in the scribe lines). The paired test pads of the circuits inside a semiconductor chip may be arranged as test lines, as shown in FIG. 3, or in any other form such as pad arrays, as long as the probe cards also have paired test pins whose arrangements match that of the paired test pads.

Advantageously, in the embodiments of the present invention, the accuracy of the probing is significantly improved. Referring back to FIG. 4, assuming current I2 is 1 nA, and contact resistor Rc2 has a resistance of 30 Ohms, when SMU 62 tries to force a 1V voltage to node 68, the voltage at drain 48 is shifted from the desirable value by only 0.003 percent. If, however, test pads TPf and TPs are combined into one pad, as in the conventional design, and current I1 is 1 nA, the voltage shift will be 3 percent, or 30 mV, which is 1000 times greater than in the embodiments of the present invention.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
a semiconductor wafer;
integrated circuit devices in the semiconductor wafer; and
a plurality of test pads on a top surface of the semiconductor wafer and connected to the integrated circuit devices, wherein the test pads are grouped in pairs, and wherein the test pads in a same pair are electrically interconnected, and wherein at least one of test pads in an additional pair different from the same pair is physically located between the test pads in the same pair.

2. The integrated circuit structure of claim 1, wherein the test pads form a test line in a scribe line of the semiconductor wafer.

3. The integrated circuit structure of claim 2, wherein all test pads in the test line are equally spaced.

4. The integrated circuit structure of claim 1, wherein the test pads are inside a semiconductor chip in the semiconductor wafer.

5. The integrated circuit structure of claim 1, wherein no active devices are formed between the test pads in a same pair of the plurality of test pads.

6. The integrated circuit structure of claim 1, wherein a pair of the plurality of test pads is connected to a same node of one of the integrated circuit devices.

7. The integrated circuit structure of claim 6, wherein the test pads comprise a first pair, a second pair, and a third pair, and wherein the first, the second, and the third pairs are connected to a drain, a source, and a gate of a transistor in the integrated circuit devices, respectively.

8. An integrated circuit probing device comprising:
a plurality of sense-measurement-units, each comprising:
a forcing node; and
a sensing node electrically coupled to the forcing node; and
a probe card comprising a plurality of pairs of probe pins, wherein each pair of probe pins comprises a first probe pin connected to the forcing node, and a second probe pin connected to the sensing node, of a same sense-measurement-unit in the plurality of sense-measurement-units, wherein each of the plurality of sense-measurement-units is configured to force a voltage on the first probe pin, with a first current flowing through the first probe pin, and is configured to sense a second current flowing through the second probe pin, and wherein the first current is smaller than the second current by at least two orders.

9. The integrated circuit probing device of claim 8, wherein the first probe pin and the second probe pin in a same pair are next to each other and are separated by a first distance, and neighboring pairs of probe pins are separated by a second distance greater than the first distance.

10. The integrated circuit probing device of claim 9, wherein a ratio of the first distance to the second distance is between about 1/50 and 1.

11. The integrated circuit probing device of claim 8, wherein the first probe pin and the second probe pin in a same pair are placed next to each other and are separated by a first distance, and wherein neighboring pairs of probe pins are separated by a second distance equal to the first distance.

12. The integrated circuit probing device of claim 8, wherein all probe pins in the probe card are equally spaced, and wherein the first probe pin and the second probe pin in a same pair of probe pins in the plurality of pairs of probe pins are separated by at least one probe pin in a different pair of probe pins in the plurality of pairs of probe pins.

* * * * *